United States Patent [19]

Dunn

[11] Patent Number: 5,219,773
[45] Date of Patent: Jun. 15, 1993

[54] METHOD OF MAKING REOXIDIZED NITRIDED OXIDE MOSFETS

[75] Inventor: Gregory J. Dunn, Tewksbury, Mass.

[73] Assignee: Massachusetts Institute of Technology, Cambridge, Mass.

[21] Appl. No.: 803,691

[22] Filed: Dec. 3, 1991

Related U.S. Application Data

[63] Continuation of Ser. No. 544,209, Jun. 26, 1990, abandoned.

[51] Int. Cl.$^5$ .......................................... H01L 21/265
[52] U.S. Cl. ....................................... 437/42; 437/11; 437/978; 437/43
[58] Field of Search ................. 437/242, 42, 17, 43, 437/11, 12, 29, 40; 358/23.15

[56] References Cited

U.S. PATENT DOCUMENTS

| | | | |
|---|---|---|---|
| 4,043,836 | 8/1977 | Sun | 437/11 |
| 4,184,896 | 1/1980 | Millea | 437/173 |

FOREIGN PATENT DOCUMENTS

0058363  4/1982  Japan ..................... 437/11

OTHER PUBLICATIONS

Improved Hot-Carrier Immunity in Submicrometer MOSFET's with Reoxidized Nitrided Oxides Prepared by Rapid Thermal Processing, Takashi Hari et al., IEEE Electronic device letter.

Dunn and Wyatt, *IEEE Transactions on Nuclear Science*, 36 (1989).

Schmidt et al., *IEEE Transactions on Electron Devices*, 35(10): 1627-1632 (1988).

Sundaresan et al., *IEEE Transactions on Nuclear Science*, NS-33(6): 1223-1227 (1986).

*Primary Examiner*—Olik Chaudhuri
*Assistant Examiner*—Long Pham
*Attorney, Agent, or Firm*—Hamilton, Brook, Smith & Reynolds

[57] ABSTRACT

A method of fabricating a field-effect device having a gate dielectric of reoxidized nitrided oxide (RNO) provides an inversion layer mobility much higher than that of conventional RNO devices. A conductivity structure such as a metal oxide semiconductor field-effect transistor (MOSFET) is formed in a semiconductor substrate and provided with a gate dielectric of RNO. The formation of the device may or may not make use of rapid thermal processing techniques. Once formed, the device is irradiated with ionizing radiation. A voltage potential may be maintained across the gate dielectric during irradiation to further improve the inversion layer mobility. Post-radiation annealing is then performed at a controlled temperature.

34 Claims, 8 Drawing Sheets

METHOD OF MAKING REOXIDIZED NITRIDED OXIDE MOSFETS

GOVERNMENT SUPPORT

This invention was made with Government support under Contract No. F19628-90-C-0002 awarded by the Department of the Air Force. The Government has certain rights in the invention.

This is a continuation of co-pending application Ser. No. 07/544,209 filed on Jun. 26, 1990, now abandoned.

BACKGROUND OF THE INVENTION

Reoxidized nitrided oxide (RNO) is a promising candidate for application as the gate dielectric in metal-oxide-semiconductor field-effect transistors (MOSFETs). Certain properties of RNO provide it with some distinct advantages over conventional silicon dioxide. Besides being less sensitive to ionizing radiation and to channel hot carrier stress, RNO acts as a superior barrier to the diffusion of contaminants from the gate into the substrate. RNO also exhibits a substantially improved charge-to-breakdown value. A singular drawback of RNO has been its characteristically lower inversion layer mobility, particularly for n-channel devices.

SUMMARY OF THE INVENTION

The use of RNO as a gate dielectric in MOSFETs, although providing some advantage, has traditionally been avoided because of inversion layer mobilities which are typically 10%-20% lower than devices using conventional silicon dioxide gates. However, by applying the methods described herein, RNO devices are fabricated having inversion layer mobility rates at least 14% better than has been achieved in past RNO devices. This makes the RNO device of the present invention a desirable alternative to conventional silicon dioxide gate devices.

In accordance with the present invention, a method is provided for fabricating a field-effect transistor having a gate dielectric of RNO, and uncharacteristically high inversion layer mobility. It has been determined that the mobility is increased by irradiating the RNO and underlying semiconductor and subsequently annealing the structure.

The fabrication process involves providing a semiconductor substrate having a channel region of a first conductivity type. A gate dielectric of RNO is then provided adjacent the channel region. The RNO gate dielectric is typically provided by first growing a layer of silicon dioxide on the surface of the substrate which overlaps the channel region. Nitridation of the gate dielectric is then accomplished by a method such as exposing the dielectric to an ammonia atmosphere at a high temperature. Once nitridation is complete, reoxidation of the nitrided oxide is performed. Exposing the dielectric to an oxygen atmosphere at a relatively high temperature adequately reoxidizes the material.

Once the reoxidized, nitrided gate dielectric is provided, a conductivity structure is formed in the substrate. The conductivity structure has regions of a second conductivity type which is different than the first conductivity type of the channel region. These regions are formed to be at least partially separated in the substrate by the channel region.

After forming the conductivity structure, the dielectric material is irradiated with ionizing radiation. In one embodiment, a voltage potential is applied across the gate dielectric during irradiation. The irradiation may be an independent step, or it can occur during an x-ray lithography fabrication sequence. Following irradiation of the material, the substrate and gate dielectric are annealed in an anneal of relatively low temperature. Contacts for the source, drain and gate of a transistor can then be added to complete the device.

The foregoing procedure has been found to greatly improve the performance of RNO field-effect devices, making them more competitive with conventional silicon dioxide gate devices. The improved inversion layer mobility, and the RNO durability characteristics previously described, makes the improved RNO field-effect device of the present invention a desirable alternative to conventional silicon dioxide devices.

DETAILED DESCRIPTION OF A PREFERRED EMBODIMENT

Figure 1:
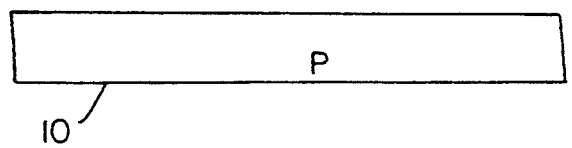
FIG. 1 shows a p-type semiconductor substrate.
Figure 2:
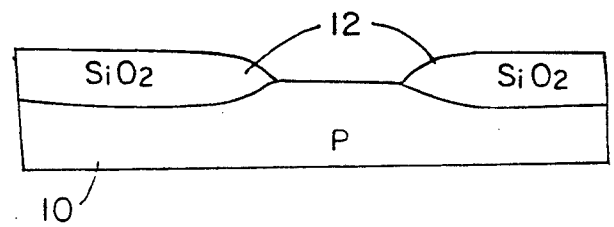
FIG. 2 shows the substrate of FIG. 1 after a LOCOS oxidation technique.

Shown in FIG. 1 is a p-type silicon substrate 10 from which an n-channel MOSFET is to be formed. Field oxide regions 12 are grown on the substrate 10 using a "LOCOS" (LOCal Oxidation of Silicon) method. The LOCOS method is a commonly practiced method in the art of semiconductor processing and allows the selective oxidation of the regions 12 of silicon substrate 10. As shown in FIG. 2, the oxide regions 12 lie to either side of an unaffected region of the silicon substrate 10.

The surface of the oxide regions 12 are at a higher elevation than the unaffected region as a result of the LOCOS process.

Figure 3:
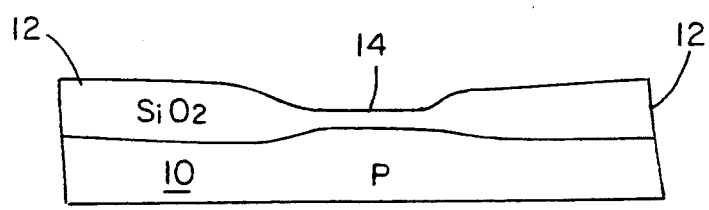
FIG. 3 shows the structure of FIG. 2 after further oxidation.

Following the LOCOS step, a blanket oxidation step is performed which results in the further oxidation of the substrate as shown in FIG. 3. This step is performed by placing the entire substrate in an oxygen atmosphere at a temperature of 1000° C. The result is formation of an oxide layer 14 over the previously unaffected region of the silicon substrate. The region 14 will become the gate dielectric of a semiconductor device.

Figure 4:
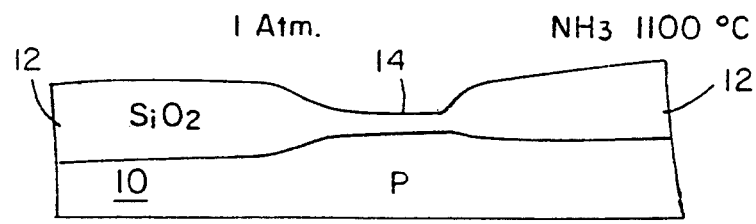
FIG. 4 shows the nitridation of a gate region of the structure of FIG. 3.

Once a sufficient oxide layer is formed in the dielectric region 14, nitridation of the region 14 is performed by exposing the region to an ammonia atmosphere at a temperature of approximately 1100° C. This step is shown in FIG. 4, and is performed at approximately atmospheric pressure. However, the atmosphere, temperature and pressure conditions of the nitridation step shown in FIG. 4 represent a preferred embodiment of the present invention. Other methods of nitridation are also compatible with the present fabrication process. In this embodiment, the entire substrate 10 is given 15 minutes of ammonia exposure. However, time, temperature and pressure may be varied while still achieving the same result. Upon completion of the ammonia exposure, the gate dielectric material 14 has become a nitrided oxide.

Figure 5:
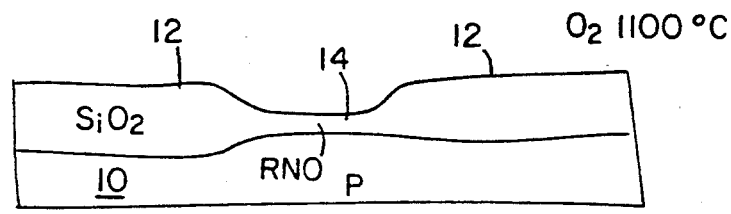
FIG. 5 shows the reoxidation of the nitrided gate region of the structure of FIG. 4.

Once nitridation of the dielectric 14 is complete, the nitrided oxide is reoxidized to form RNO. Reoxidation of the dielectric material can be accomplished in a number of different ways. In the present embodiment, the substrate 10 is placed in an oxygen atmosphere at 1100° C. for 10 to 15 minutes, as demonstrated in FIG. 5. However, other methods of reoxidizing the nitrided oxide are also compatible with the present invention. The reoxidation of the gate dielectric 14 results in the dielectric becoming RNO.

Once the RNO region 14 is formed, a layer 16 of polysilicon is deposited on the surface of the structure using a conventional deposition technique. In the present embodiment, a low-pressure chemical vapor deposition is used. This polysilicon layer 16 is then heavily doped with an active dopant material. In the present embodiment, the dopant is an n-type dopant such as arsenic. However, a p-type doping material may alternatively be used to give the polysilicon the desired conductivity properties.

Figure 6:
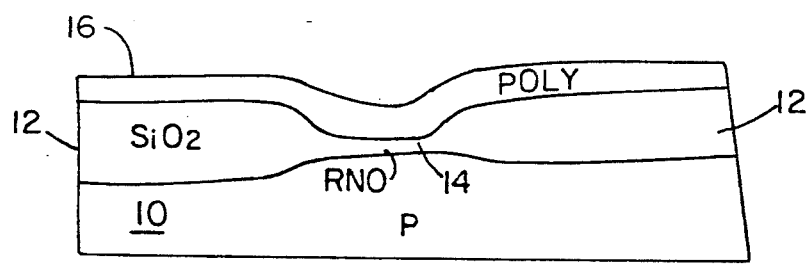
FIG. 6 shows the deposition of a polysilicon layer on the structure of FIG. 5.
Figure 7:
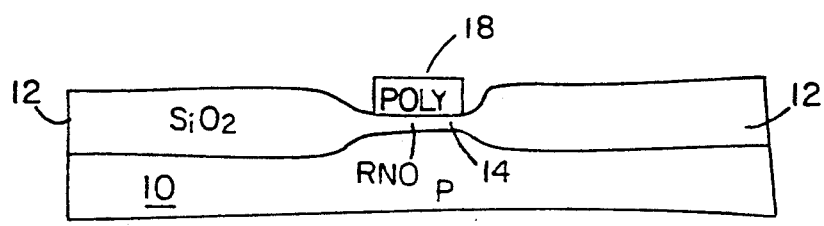
FIG. 7 shows the etching away of the polysilicon layer of the structure of FIG. 6 to leave a conductive gate.

As shown in FIG. 6, the polysilicon layer 16 covers the oxide regions 12 and the gate dielectric 14. Because of the elevated oxide regions 12, the polysilicon "rides-up" on these regions 12 to completely cover the top of the structure. A plasma etching technique is then used to etch the polysilicon away completely except for a portion 18 directly above the RNO gate dielectric. Using a photo-resist material which is developed on the region of the polysilicon over the dielectric 14, the etching removes all the polysilicon except for the portion 18 above the dielectric 14. The thickness of the polysilicon layer is such that after etching, the top of the remaining region 18 is approximately level with the top of the silicon dioxide regions 12. This conductive polysilicon region 18 becomes the gate of the MOSFET structure, and is shown in FIG. 7 after the etching procedure. Although plasma etching is used in the present embodiment, common etching techniques other than plasma etching may also be used to form the gate 18.

Figure 8:
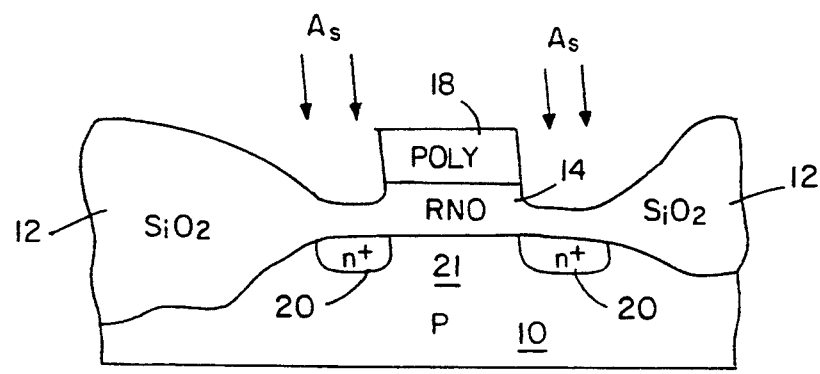
FIG. 8 shows the implantation of dopant in the substrate of the structure of FIG. 7.

Once the gate 18 is formed, source and drain regions 20 are implanted in the substrate 10 using a self-aligned ion implantation technique. In the present embodiment, the implanted dopant is arsenic to create n-type source and drain regions in the p-type semiconductor substrate. This step is shown in FIG. 8. With accurate control during implantation, no other part of the semiconductor structure is affected by the ion implantation. Once completed, the dopant is activated by annealing the structure in an oxygen atmosphere. Other doping techniques and dopant materials may alternatively be used to create the n-type regions 20.

Figure 9:
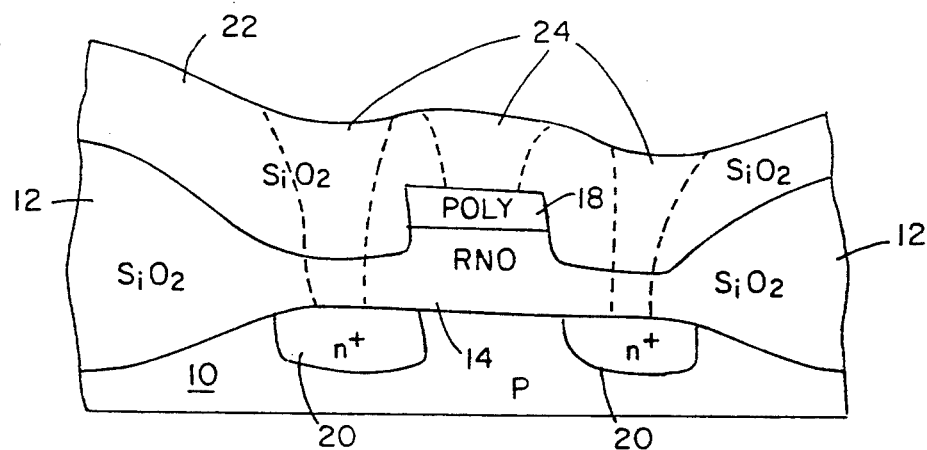
FIG. 9 shows the deposition of an oxide layer on the structure of FIG. 8 indicating regions to be etched for contact holes.
Figure 10:
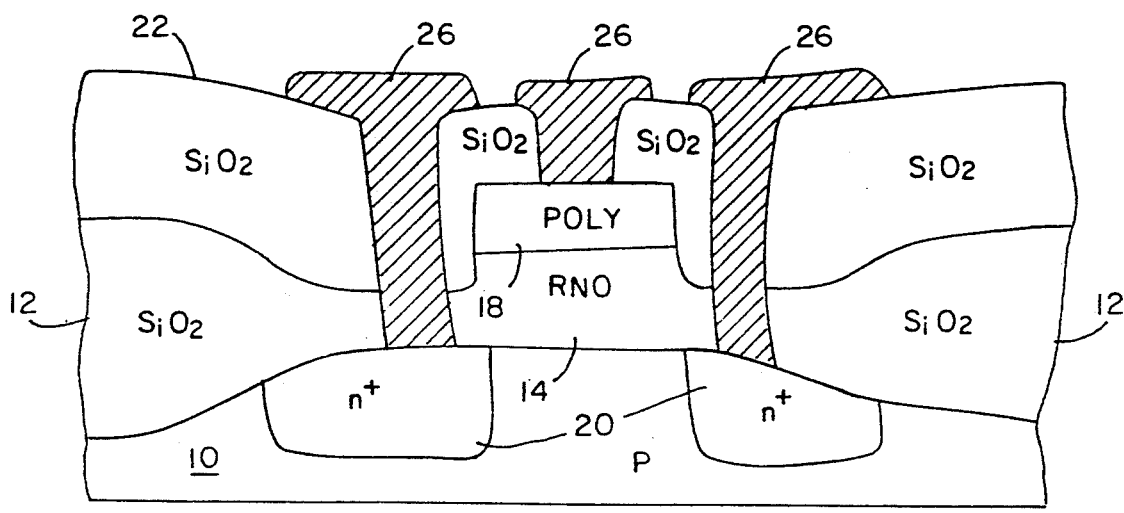
FIG. 10 shows the addition of metal contacts to the structure of FIG. 9.

After doping, the MOSFET structure of the semiconductor has essentially been formed. As shown in FIG. 9, the entire structure is coated with a layer 22 of insulating silicon dioxide. Contact holes 24 are etched in the layer 22 using a masking technique to expose the surface of the n-type source and drain regions 20 and the gate 18, while protecting other portions of the structure. Once these regions are etched away, metal is then deposited on the structure. The metal fills the contact holes 24 making contact with regions 20 and 18. The material is then masked again, and the metal is etched to remove all but the portions filling the contact holes 24. These three portions represent three separate metal contacts of the semiconductor device. These contacts allow contact between external leads and the gate, source and drain regions of the device. The structure is shown after etching of the metal contacts in FIG. 10.

Figure 11:
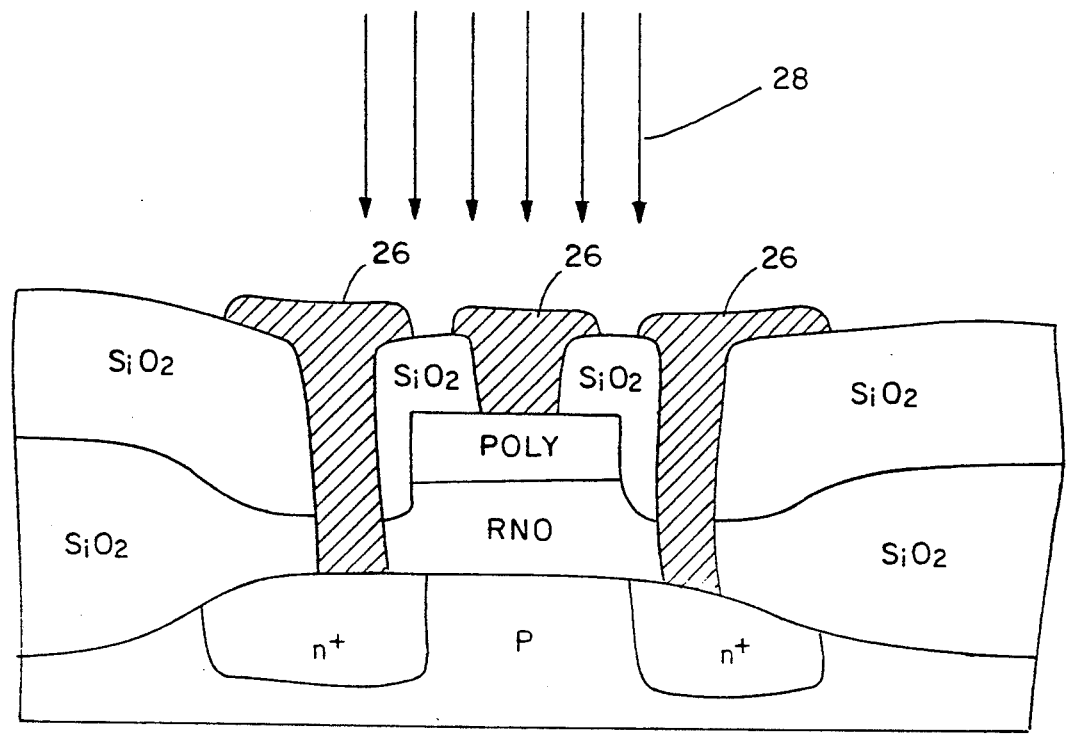
FIG. 11 shows the irradiation of the completed structure of FIG. 10.

Once the device is fabricated, the entire structure, including the gate dielectric 14, is irradiated with ionizing radiation 28 as shown in FIG. 11. In the present embodiment, the radiation is 10 keV x-rays. A total dose of 200 Mrad is applied before irradiation is complete. Other types of radiation may also be suitable assuming they are sufficient to create electron-hole pairs in the dielectric material 14.

In one alternative embodiment, the required radiation is absorbed during an x-ray lithography fabrication sequence. This allows conventional fabrication techniques to be combined with the irradiation step of the present method. Electron beam radiation or radiation from a reactive ion etching process may also be used to apply the required radiation to the RNO dielectric material 14. Masking may also be provided to limit the locations receiving the radiation.

Figure 12:
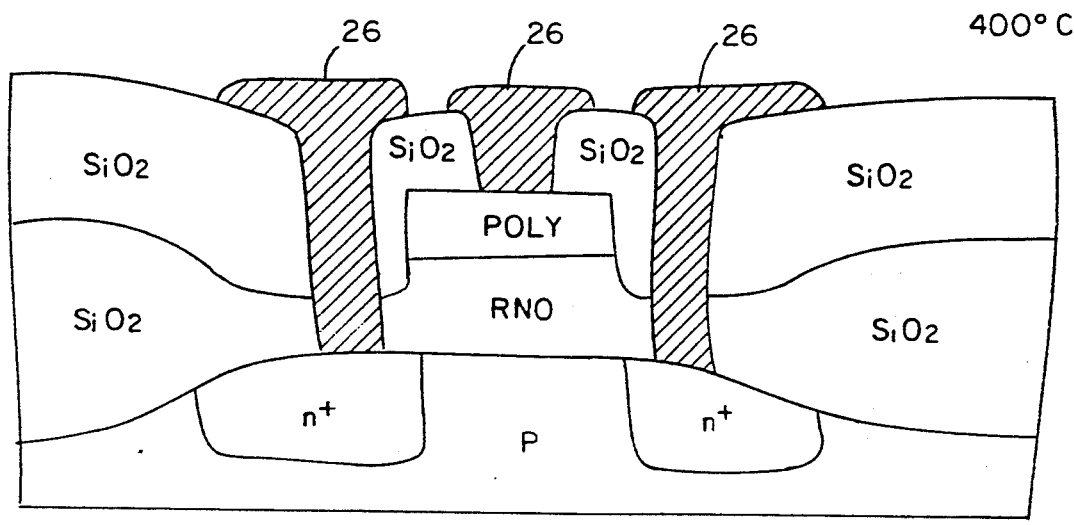
FIG. 12 shows the annealing of the irradiated structure of FIG. 11.
Figure 13:
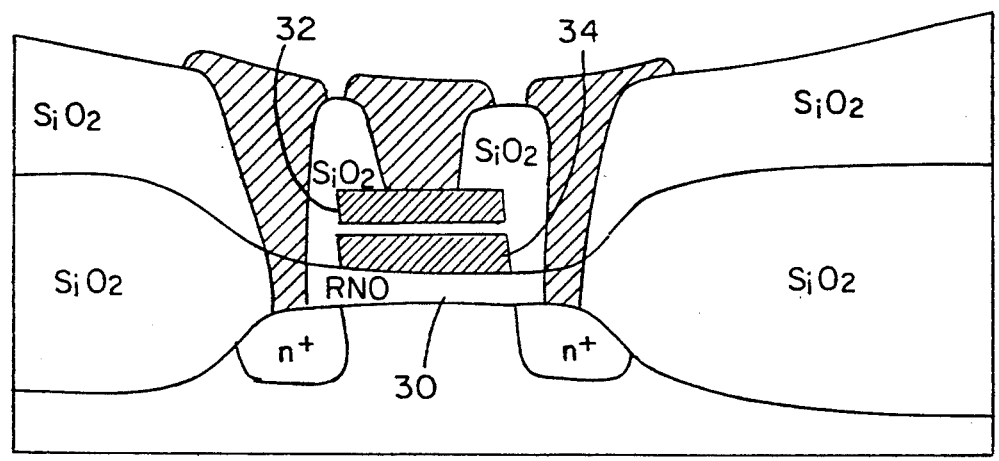
FIG. 13 shows a floating gate memory device structure made with the method of the present invention.

After radiation of the dielectric material 14, a post-radiation annealing step is performed, as shown in FIG. 12. The anneal temperature may be selected from a range of anywhere from 100° C. to 200° C., but in general is kept relatively low. In the present embodiment the annealing was performed at 400° C. for 30 minutes in an ambient of nitrogen/3% hydrogen. Purely inert ambients such as nitrogen or argon are effective in the annealing process. In addition, the combinations of these elements with hydrogen are also suitable as ambients.

The unpopular characteristic of low inversion layer mobility is the traditional drawback of RNO gate dielectrics. However, the foregoing process provides a device with much improved mobility characteristics, while retaining the other desirable features of RNO. Preliminary testing has shown at least a 14% increase in inversion layer mobility for MOSFETs fabricated by the foregoing procedure over those formed with conventional RNO procedures. With further refinement of the disclosed techniques, larger increases are expected.

While the invention has been particularly shown and described with reference to a preferred embodiment thereof, it will be understood by those skilled in the art that various changes in form and details may be made therein without departing from the spirit and scope of the invention as defined by the appended claims. For example, numerous variations exist for the formation process of the MOSFET with the RNO gate dielectric. Most any combination of traditional fabrication techniques is satisfactory prior to the radiation and annealing steps of the fabrication procedure.

Figure 14:
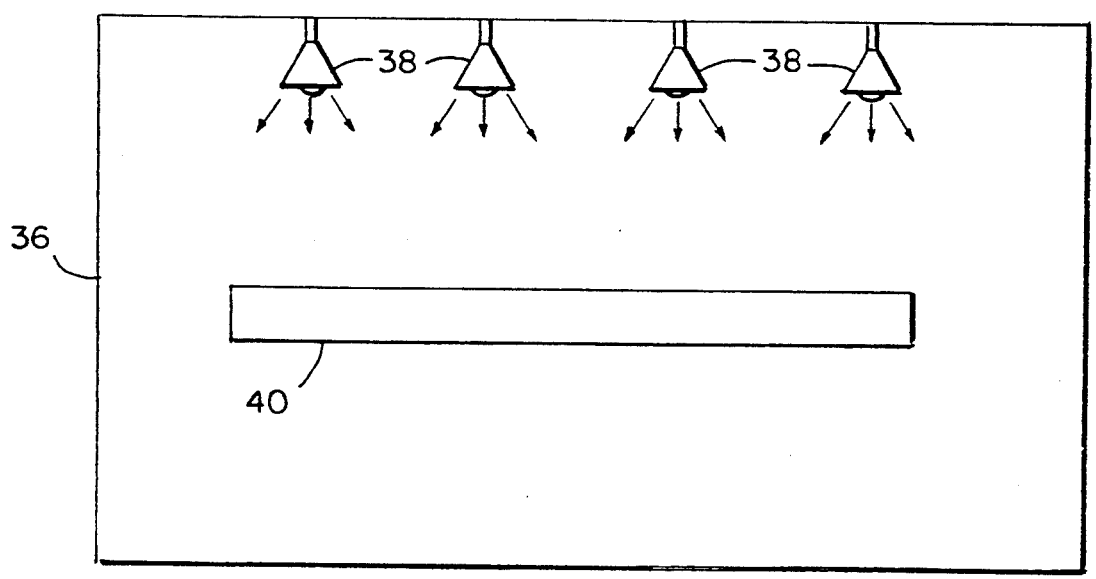
FIG. 14 shows a rapid thermal processing unit for use with the present invention.

The foregoing method is suitable for most any device using inversion layer principles. Multi-gate devices such as a floating gate non-volatile memory devices are but one example. A typical floating gate device structure using the foregoing method is shown in FIG. 14. The fabrication of such a device is performed using conventional techniques with RNO being the dielectric material 30. The two gates 32, 34 of the structure are separated by a silicon dioxide layer, but the RNO layer 30 acts as the gate dielectric to the device. With modification of the RNO layer 30 through the radiation and annealing steps of the present invention, inversion layer mobility improvement is effected as it is in the conventional MOSFET device. Examples of floating gate devices which would benefit from the present invention include, but are not limited to, EPROMS, EEPROMS, and Flash EEPROMS.

One alternative method of forming the RNO gate dielectric of the present invention is by rapid thermal processing. Rapid thermal processing involves heating the semiconductor material rapidly by means of very intense lamps. An illustration of a rapid thermal unit 36 as used with this technique is shown in FIG. 14. The semiconductor material 40 carries one or more of the device structures being fabricated by the present method. Heat lamps 38 provide the rapid heating associated with this process. The initial oxidation, nitridation and reoxidation steps in forming the RNO gate dielectric can be performed in the rapid thermal unit 36, as opposed to a furnace. It is also possible to combine the use of a furnace and a rapid thermal unit 28. It is important to note, however, that high temperature may disturb the results of the radiation and annealing steps, so it is desireable to perform irradiation and annealing after all high temperature steps are complete.

Nitridation in the preferred fabrication embodiment was performed at atmospheric pressure. However, high pressure nitridation may also be used. In addition, plasma-enhanced nitridation is another possible alternative.

Virtually any form of ionizing radiation seems to be adequate to perform the irradiating step of the fabrication process. The magnitude of the radiation doses affects the resulting inversion layer mobility of the MOSFET. However, the type of radiation may be varied for convenience. Electron beam radiation, radiation from a reactive ion etching process, photons with energy greater than 8 ev, gamma rays, and any energy of x-rays all seem to be acceptable for the irradiation step.

The reason for the improved inversion layer mobility appears to be the creation of electron-hole pairs in the channel region by the ionizing radiation. As electrons and holes are freed up, the inversion layer mobility of the channel region increases. Although the type of radiation does not seem to matter, the dose level affects the number of electron-hole pairs produced, and therefore the mobility increase.

Figure 15:
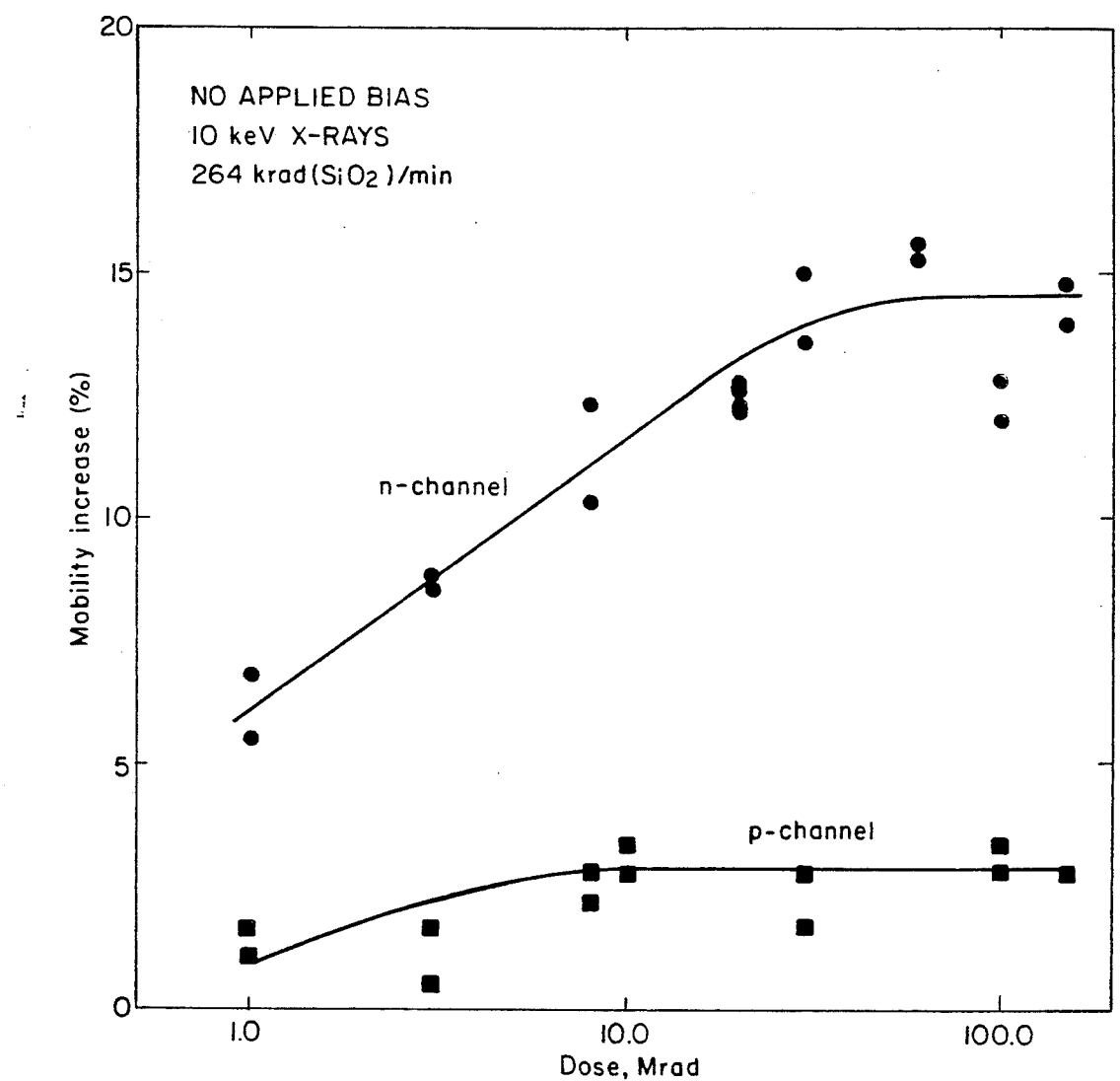
FIG. 15 is a plot of percent inversion layer mobility increase versus radiation dose for both n-channel and p-channel devices.

The graph of FIG. 15 shows percent mobility increase with increasing radiation doses for both n-channel and p-channel RNO devices. As shown, the increase for n-channel devices is more pronounced than for p-channel devices. For n-channel devices, the increase in mobility with dose is almost completely leveled out by 90 to 100 Mrad. At that point, the increase in mobility is about 14%. The mobility increase for the p-channel device levels out to about 3% at about 10 Mrad.

Figure 16:
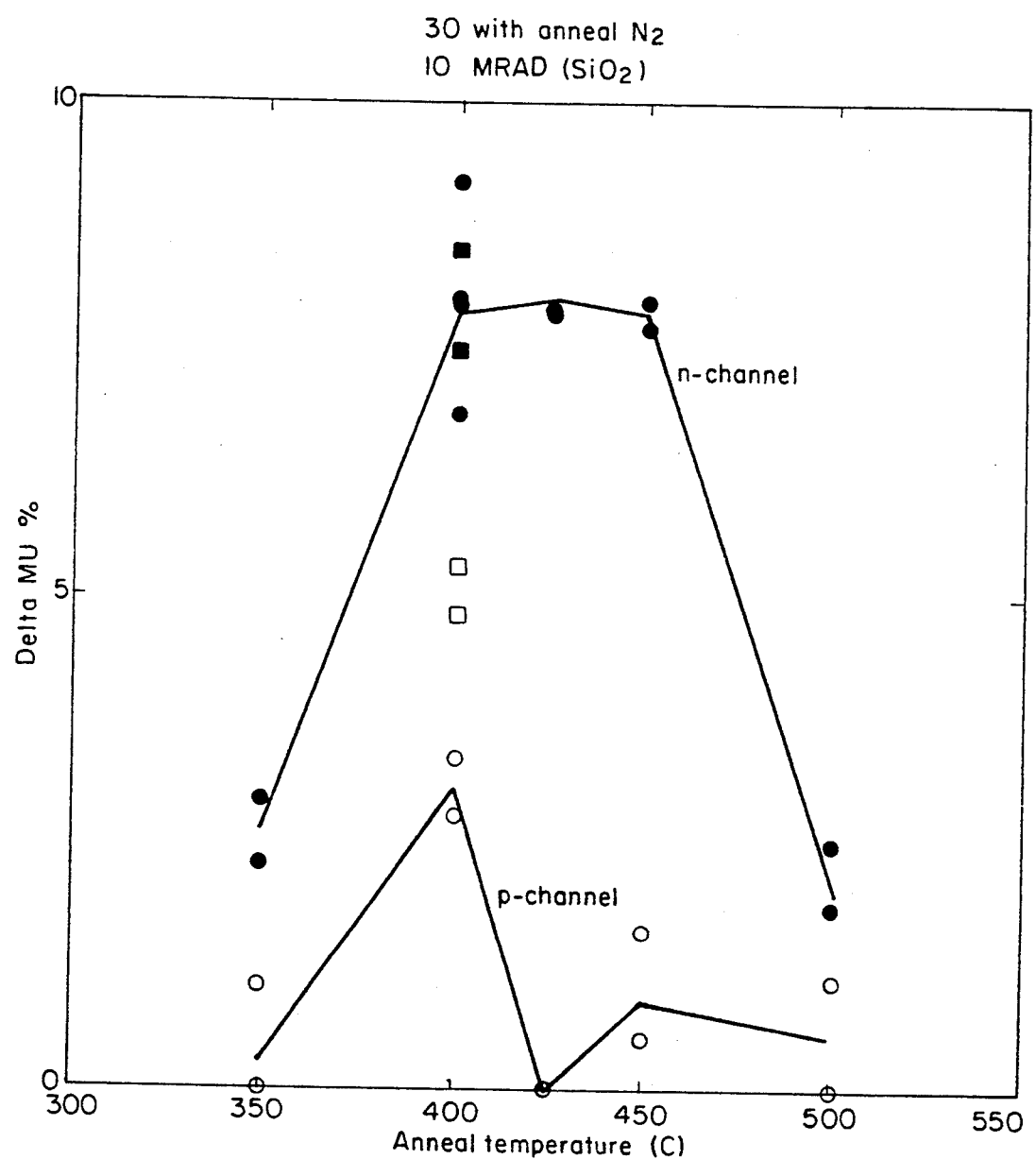
FIG. 16 is a plot of percent inversion layer mobility increase versus anneal temperature for both n-channel and p-channel devices.

Shown in FIG. 16 is a graph of the percent increase of inversion layer mobility versus anneal temperature. The mobility increases result from a combination of the irradiation and the annealing steps, and FIG. 16 demonstrates the importance of the post-radiation annealing. As shown, the optimum temperature for a 30-minute nitrogen anneal of an n-channel RNO device having been irradiated with a 10 Mrad radiation dose falls into a range of about 400° C. to about 475° C. However, it should be noted that the optimum temperature range is expected to fluctuate with the duration of the anneal. In such a case, it might be possible for the optimum temperature to be increased if the anneal duration was decreased.

Figure 17:
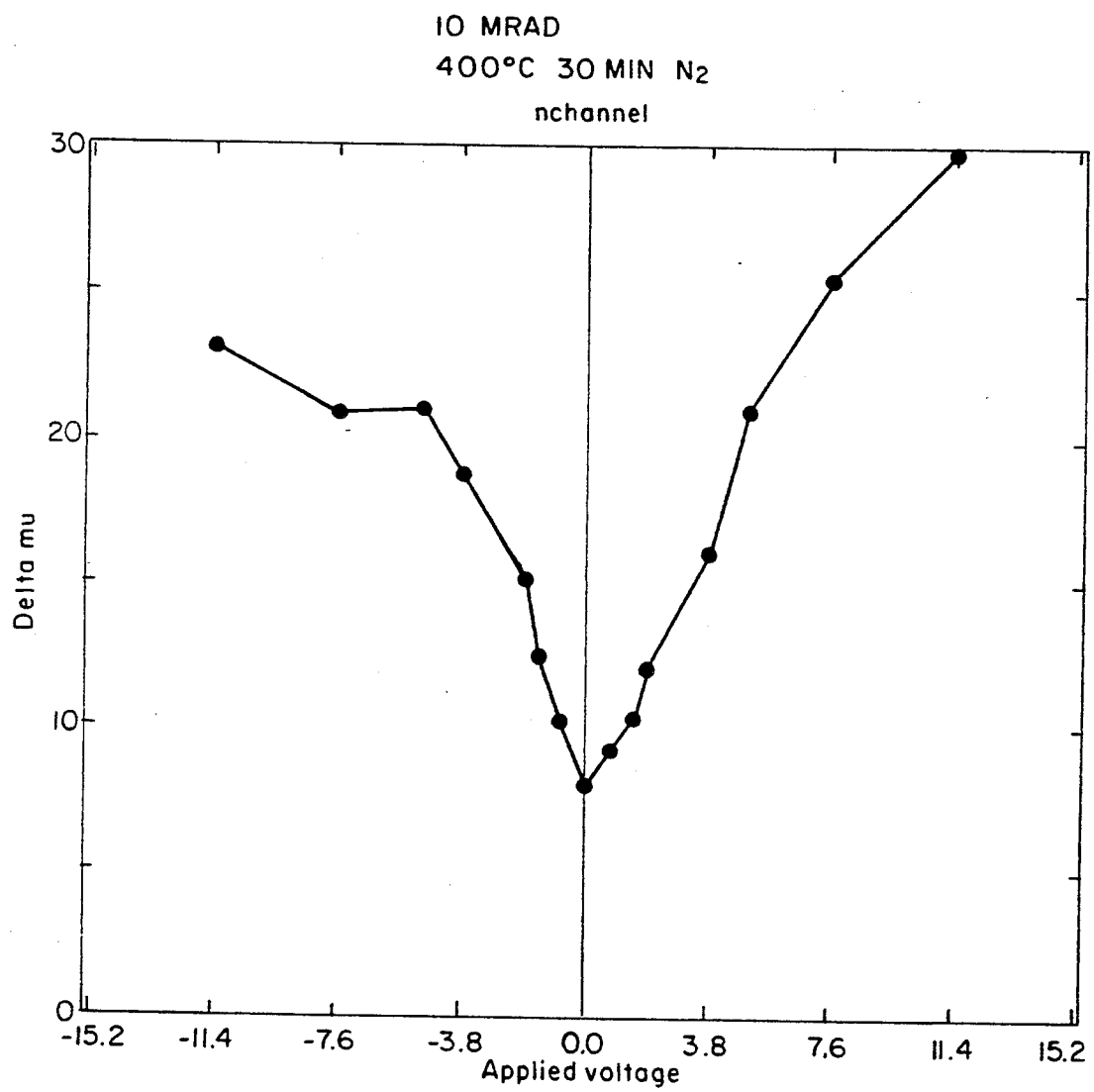
FIG. 17 is a plot of percent inversion layer mobility increase versus applied voltage potential across the gate dielectric of an n-channel device.

The graphs of FIGS. 15 and 16 show the mobility increase with dose and anneal temperature when no voltage is applied to the device. However, even higher increases in mobility are achievable if a voltage is applied across the channel region while the irradiation step is performed. An example of this is demonstrated by the graph of FIG. 17. This graph shows how a n-channel RNO device responds to different applied voltages while the irradiation of the device is being accomplished. For the different applied voltages FIG. 17, the dose is kept constant at 10 Mrad, and the annealing is at 400° C. for 30 min in an $N_2$ atmosphere. The test device has a 38 nm gate dielectric. In FIG. 17, a 3.8 V applied voltage corresponds to about 1 MV/CM, for the scale of fabrication being used.

As shown, both positive and negative voltages increase the inversion layer mobility, and increases of up to about 30% are obtainable with an applied voltage of about +11.4 V. The better increases appear to be due to the separation of electrons and holes at the time electron-hole pairs are created, and less recombination of the electron-hole pairs. The voltage draws the negatively charged electrons in one way and the positive "holes" move in the other direction. The voltage is preferably applied directly to the gate of the completed device. However, an electric field may be applied externally across the entire device. A magnetic field should also be effective in creating the desired effect.

Various anneal temperatures and ambient annealing atmospheres may be combined to achieve different results. For example, purely inert ambients may be used alone or be combined with hydrogen for particularly good results. The anneal time may be balanced with the anneal temperature to arrive at the desired device characteristics.

I claim:

1. A method of fabricating a field-effect semiconductor device, the method comprising:
   providing a semiconductor substrate having a channel region of a first conductivity type;
   providing a gate dielectric of reoxidized nitrided oxide adjacent the channel region of the substrate;
   forming in the substrate a conductivity structure having regions of a second conductivity type different than said first conductivity type, the regions being at least partially separated in the substrate by said channel region;

irradiating the reoxidized nitrided oxide gate dielectric with ionizing radiation sufficient to create electron-hole pairs in the gate dielectric; and annealing the substrate and gate dielectric at about 400° C. or greater for a duration in the order of thirty minutes such that there is a significant improvement in inversion layer mobility rate.

2. A method according to claim 1 wherein the field-effect device is a MOSFET.

3. A method according to claim 1 wherein the field-effect semiconductor device is a floating gate memory device.

4. A method according to claim 1 wherein providing a semiconductor substrate comprises providing a silicon substrate.

5. A method according to claim 1 wherein providing a semiconductor substrate comprises providing a p-type semiconductor substrate.

6. A method according to claim 1 wherein the annealing of the substrate and gate dielectric is at about 400° C.–475° C.

7. A method according to claim 1 wherein annealing the substrate and gate dielectric comprises annealing at a temperature which is dependent on the duration of the annealing.

8. A method according to claim 1 wherein forming a gate dielectric of reoxidized nitrided oxide comprises initially forming said gate dielectric from a silicon dioxide material.

9. A method according to claim 8 wherein forming a gate dielectric of reoxidized nitrided oxide comprises exposing said gate dielectric to an ammonia atmosphere.

10. A method according to claim 9 wherein the exposing of said gate dielectric to an ammonia atmosphere is done in at a relatively high temperature.

11. A method according to claim 10 wherein said relatively high temperature is within a range of about 1000° C. to 1200° C.

12. A method according to claim 9 wherein the time of said exposure to the ammonia atmosphere is approximately 15 minutes at atmospheric pressure.

13. A method according to claim 9 wherein the time of said exposure to the ammonia atmosphere is decreased with increased ambient pressure.

14. A method according to claim 9 wherein forming a gate dielectric of reoxidized nitrided oxide includes exposing the gate dielectric to an oxygen atmosphere after it is exposed to said ammonia atmosphere.

15. A method according to claim 14 wherein the exposing of said gate dielectric to an oxygen atmosphere is done at a relatively high temperature of about 900° C. to 1200° C.

16. A method according to claim 14 wherein the time of said oxygen exposure is decreased as the ambient pressure is increased.

17. A method according to claim 1 further comprising maintaining a voltage potential across the channel region while irradiating the gate dielectric.

18. A method according to claim 17 wherein the voltage potential on the gate dielectric is a minimum of 1 MV/cm.

19. A method according to claim 1 wherein irradiating the gate dielectric with ionizing radiation comprises irradiating the gate dielectric with a minimum dose of about 10 Mrad.

20. A method of fabricating a field-effect semiconductor device, the method comprising:

providing a semiconductor substrate having a channel region of a first conductivity type, the channel region being adjacent a first surface of the substrate;

providing a silicon dioxide gate dielectric on the first surface of the substrate adjacent the channel region;

nitriding the gate dielectric to form a nitrided oxide gate dielectric;

reoxidizing the nitrided oxide gate dielectric to form a reoxidized nitrided oxide gate dielectric;

forming regions of a second conductivity type in said substrate, the regions being along the first surface of the substrate and being separated by said channel region;

irradiating the reoxidized nitrided oxide gate dielectric with ionizing radiation sufficient to create electron-hole pairs in the gate dielectric; and annealing the substrate and gate dielectric at about 400° C. or greater for a duration in the order of thirty minutes such that there is a significant improvement in inversion layer mobility rate.

21. A method according to claim 20 further comprising providing a conductive gate adjacent to the gate dielectric to the side of the dielectric away from the substrate.

22. A method according to claim 21 wherein providing a conductive gate comprises providing a doped polysilicon gate.

23. A method according to claim 21 further comprising providing metal contacts for providing electrical conduction paths to the gate and to each of the regions of second conductivity type.

24. A method according to claim 20 wherein providing a silicon dioxide gate dielectric includes using rapid thermal processing.

25. A method according to claim 20 wherein the nitriding of the gate dielectric is accomplished at a temperature within the range of 700° C.–1300° C.

26. A method according to claim 20 wherein irradiation of the gate dielectric uses radiation of less than about 500 Mrad.

27. A method according to claim 20 wherein the annealing temperature is within the range of 400° C.–1200° C.

28. A method according to claim 20 wherein the annealing temperature is about 400° C.

29. A method according to claim 20 wherein annealing the substrate and gate dielectric comprises annealing in an ambient atmosphere of inert gas.

30. A method according to claim 29 wherein said ambient atmosphere includes nitrogen.

31. A method according to claim 20 wherein the field-effect semiconductor device is a MOSFET.

32. A method according to claim 20 wherein the field-effect semiconductor device is a floating gate memory device.

33. A method of improving the inversion layer mobility of an n-channel MOSFET with a reoxidized nitrided oxide gate dielectric, the method comprising:

irradiating the MOSFET with ionizing radiation sufficient to create electron-hole pairs in the gate dielectric; and annealing the MOSFET at about 400° C. or greater after said irradiating of the MOSFET for a duration in the order of thirty minutes such that there is a significant improvement in inversion layer mobility rate.

34. A method of fabricating a MOSFET comprising:
providing a semiconductor substrate having a channel region of a first conductivity type
forming a silicon dioxide gate dielectric on a surface of the substrate adjacent the channel region;
exposing the gate dielectric to an ammonia atmosphere at a relatively high temperature to form a nitrided oxide gate dielectric;
exposing the gate dielectric to an oxygen atmosphere at a relatively high temperature to form a reoxidized nitrided oxide gate dielectric;
forming a source region and a drain region each of a second conductivity type in the semiconductor substrate such that the source and drain regions are separated in the substrate by said channel region;
irradiating the reoxidized nitrided oxide gate dielectric with ionizing radiation sufficient to create electron-hole pairs in the gate dielectric; and
annealing the substrate and gate dielectric at about 400° C. or greater for a duration int he order of thirty minutes such that there is a significant improvement in inversion layer mobility rate.

* * * * *